United States Patent
Drake et al.

(10) Patent No.: US 9,767,917 B2
(45) Date of Patent: Sep. 19, 2017

(54) MITIGATION SCHEME FOR SRAM FUNCTIONALITY

(71) Applicant: International Business Machines Corporation, Armonk, NY (US)

(72) Inventors: Alan J. Drake, Round Rock, TX (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 14/881,718

(22) Filed: Oct. 13, 2015

(65) Prior Publication Data

US 2017/0103817 A1    Apr. 13, 2017

(51) Int. Cl.
| | |
|---|---|
| G11C 11/413 | (2006.01) |
| G11C 29/12 | (2006.01) |
| G11C 11/419 | (2006.01) |
| G11C 11/418 | (2006.01) |
| G11C 29/00 | (2006.01) |

(52) U.S. Cl.
CPC .......... *G11C 29/12* (2013.01); *G11C 11/418* (2013.01); *G11C 11/419* (2013.01); *G11C 29/76* (2013.01)

(58) Field of Classification Search
CPC .................................................. G11C 11/413
USPC ........................................................ 365/154
See application file for complete search history.

(56) References Cited

U.S. PATENT DOCUMENTS

| | | |
|---|---|---|
| 5,450,426 A | 9/1995 | Purdham et al. |
| 5,996,096 A | 11/1999 | Dell et al. |
| 6,341,093 B1 | 1/2002 | Eckert et al. |
| 6,397,349 B2 | 5/2002 | Higgins et al. |
| 7,076,376 B1 | 7/2006 | Weiss et al. |
| 7,076,706 B2 | 7/2006 | Eckelman et al. |
| 7,283,410 B2 | 10/2007 | Hsu et al. |
| 7,324,391 B2 | 1/2008 | Loh et al. |
| 7,508,697 B1 | 3/2009 | Mukhopadhyay et al. |
| 7,596,729 B2 | 9/2009 | Adsitt |
| 7,759,980 B2 * | 7/2010 | Kao ............... H03K 5/1534 326/38 |
| 8,405,413 B2 | 3/2013 | Carpenter et al. |

(Continued)

FOREIGN PATENT DOCUMENTS

WO    WO 2013/040065 A1    3/2013

*Primary Examiner* — Min Huang
(74) *Attorney, Agent, or Firm* — Scully, Scott, Murphy & Presser, P.C.; Rabin Bhattacharya, Esq.

(57) ABSTRACT

An system and method are configured to degrade a memory cell PFET voltage based on a sensor reading of a current operating point. This will enable additional control over the SRAM device, particularly during a write operation. In one embodiment, a system of SRAM memory devices is configured as a smart sensor with real-time corrective circuit action. The system and method samples write and read timing operations and is adaptable by performing real-time corrective action. The degrading of PFET voltage to reduce it strength and improve write characteristics include an implementation that includes a charge pump controllable for altering by decreasing a voltage applied to the PFET of a selected memory cell. In a further embodiment, an edge detector is built into the circuit that real-time assesses the strength of the memory write operation. In a further implementation, control logic functions as a Finite State Machine.

16 Claims, 6 Drawing Sheets

(56) References Cited

U.S. PATENT DOCUMENTS

| | | | |
|---|---|---|---|
| 8,630,132 B2 | 1/2014 | Cheng et al. | |
| 8,730,713 B2 * | 5/2014 | Garg | G11C 7/04 365/154 |
| 2002/0131312 A1 * | 9/2002 | Issa | G11C 7/06 365/207 |
| 2006/0176728 A1 * | 8/2006 | Pelella | G11C 7/06 365/154 |
| 2009/0303767 A1 * | 12/2009 | Akerib | G06F 9/3879 365/49.17 |
| 2012/0008430 A1 * | 1/2012 | Tachibana | G11C 7/14 365/189.16 |
| 2012/0195109 A1 * | 8/2012 | Noro | G11C 7/08 365/154 |
| 2016/0054361 A1 * | 2/2016 | Lee | G11C 5/148 365/185.11 |

* cited by examiner

MITIGATION SCHEME FOR SRAM FUNCTIONALITY

STATEMENT REGARDING FEDERALLY SPONSORED RESEARCH OR DEVELOPMENT

This invention was made with Government support under Contract No.: HR0011-13-C-0022 awarded by Defense Advanced Research Projects Agency (DARPA). The Government has certain rights in this invention.

FIELD

The present disclosure relates generally to memory systems, and particularly to methods and circuit structures for detecting SRAM write failures and taking real-time corrective action. In one aspect the detection scheme detects write operation failures in SRAMs caused by voltage droops, temperature rise, and/or influence of other conditions. A novel correction mechanism in conjunction with the detection mechanism is provided.

BACKGROUND

Testing signal delays is one way for measuring a circuit's performance. Structures currently exist for testing signal delays in memory circuit such as SRAM cells for use in testing memory circuit performance.

In one example implementation, a circular edge detector is provided for an SRAM having memory columns that are multiplexed (muxed) into a delay path. The signal passes through each column and sets a latch at the output. The clock stops the propagation and generates a thermometer output of the columns traversed.

Such a structure could further be setup as a ring oscillator and the frequency of oscillation can be taken as a secondary measurement.

Such a structure can test delays through the SRAM cells without any actuation or write specific timing. However, it takes much of chip array area.

Further prior art include a circuit and method for path monitoring having selectable modes of operation. In the scheme there is sampled the timing of read operations with no correcting action.

In current implementations of SRAM memory devices implementing an inverter having, for example, a cross-coupled configuration of P-type and N-type field effect transistors, e.g., FinFETs, it is found that increasingly the P and N FinFETs have equivalent drive strengths.

This complicates a write phase because there is no native pull direction for the write operation: the p-type device and n-type device pull on the cell value equally.

As technology nodes become increasingly smaller, and operating voltages decrease, it would be highly desirable to correct such write phase issues and improve write characteristics.

SUMMARY

An apparatus, system and method are configured to degrade a memory cell PFET voltage based on a sensor reading of a current operating point. This will enable additional control over the SRAM device, particularly during a write operation.

According to an aspect of the present disclosure, a method of operating a memory system having an array of memory cells, each memory cell comprising a programmable memory cell providing first true bit signal and complement bit signal outputs representing a stored bit value. The method comprises: applying control signals for selecting a memory cell and controlling a bit value write or read operation performed at the selected memory cell; detecting a strength of a signal transitioning in to or out from the selected memory cell; and applying, responsive to the detected strength, a supply voltage to the selected memory cell when performing a write or read operation, the supply voltage applied modifying the strength of the selected memory in accordance with the detected signal strength.

According to another aspect of the present disclosure, there is provided a memory system. The memory system comprises: an array of memory cells, each memory cell comprising a programmable memory cell providing first true bit signal and complement bit signal outputs representing a stored bit value; a control circuit applying control signals for selecting a memory cell and controlling bit value write or read operations performed on the selected memory cell; a detection circuit for detecting a strength of a signal transitioning in to or out from the selected memory cell; and a variable voltage source for applying a supply voltage to the selected memory cell when performing a write or read operation, the supply voltage applied modifying the strength of the selected memory cell in accordance with the detected signal strength.

According to yet another aspect of the present disclosure, there is provided a method of operating a memory system having an array of memory cells, each memory cell comprising a programmable memory cell providing first true bit signal and complement bit signal outputs representing a stored bit value. The method comprises: applying control signals to a memory cell of a first column for performing a write operation; applying control signals to the memory cell of the first column for reading the stored bit value; determining from the read value, a voltage delay associated with reading the bit value; and adjusting a supply voltage applied to a memory cell of a second column based on the voltage delay, the adjusted supply voltage at the applied memory cell improving a data write operation characteristic at the memory cell of the second column.

DETAILED DESCRIPTION

The present disclosure relates to a method of detecting memory system failures, particularly of write operations occurring, in one embodiment, in a memory storage system, and real-time adapting the memory cells to improve memory cell characteristics for writing data to and reading data from at the cell. While descriptions herein are directed to Static-RAM memory (SRAM) systems, the principles herein may be employed in other types of memory systems, e.g., Dynamic RAM (DRAM).

As described herein, a real-time adapting scheme is provided to compensate for cross-chip variation in memory arrays by adapting local voltage in each sub-array. It provides a means for dynamic voltage control of arrays with sensing and actuation mechanisms in a manner that reduces overhead of sensing and control. It provides a scalable solution that can be fine-grained at the smallest sub-cell or implemented at one per array without design changes—such as in a redundant or "canary" column. The scheme further reduces dependence on strong-cell weak cell in a write stage to improve read and retention stability.

Figure 1A:
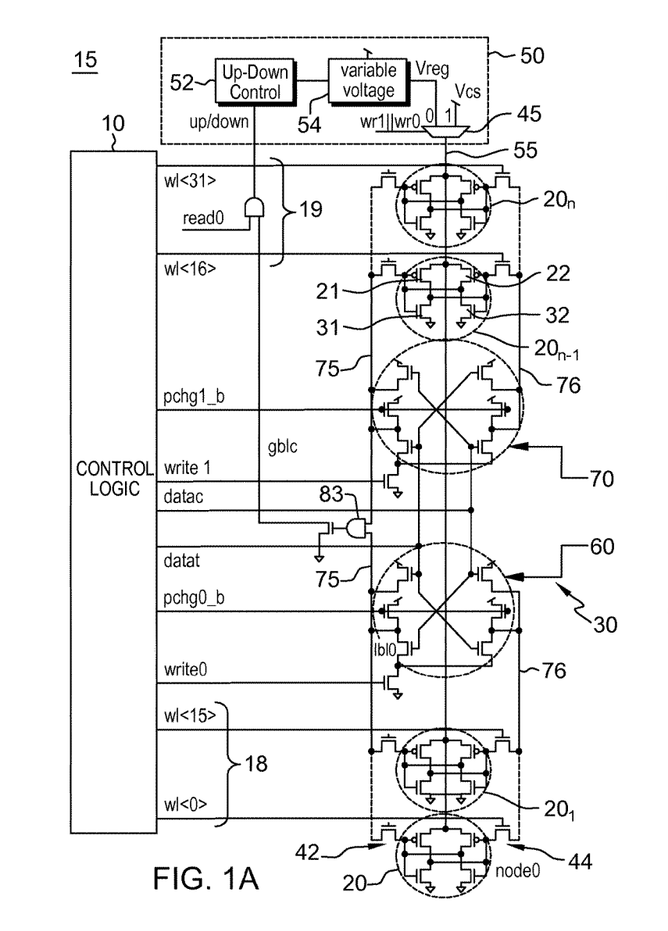
FIG. 1A is a circuit diagram for improving an memory write operation including a 3-cycle monitor with a charge pump according to an embodiment of the present disclosure.

FIG. 1A shows a control circuit 10 for improving a memory write operation in a memory system 15. The system 15 includes a 3-cycle monitor (e.g., monitoring a write delay) with a charge pump circuit 50 according to one embodiment of the present disclosure. The charge pump circuit adapts the supply voltage to the memory cell PFET to make the cell (PFET) weaker. This adaptation is based on a calibration using, for example, an automatic built in self-test (ABIST) that measures device delays. The voltage at the PFET is caused to fluctuate based on a reading operation or a writing operation.

In the SRAM memory system 15 of FIG. 1A, there is shown, for example, a "canary" (test) column comprising a plurality of SRAM cells 20 including SRAM cells $20_1, \ldots 20_{15}, 20_{16} \ldots 20_{n-1}, 20_n$ as shown, with n being 31. Each cell 20, in one embodiment, is a 6T (six transistor) cell including a pair of complementary FET devices, i.e., NFET and PFETs cross-coupled to form a bistable memory element (cell). In the cross-coupled implementation shown, the memory cell 20 includes a first set of FET transistors having a PFET transistor device 21 and NFET transistor device 31 (e.g., FinFETs) fabricated on a semiconductor substrate and connected at a terminal, and a second set of FET transistors having a PFET transistor device 22 and NFET transistor device 32 fabricated on a substrate (e.g., FinFETs). The substrate may include a silicon-on-insulator (SOI) substrate. The first set of PFET and NFET (e.g., FinFETs) transistors 21, 31 are configured to form a first inverter device and the second set of PFET and NFET (e.g., FinFETs) transistors 22, 32 is configured to form a second inverter. Furthermore, the first inverter of devices 21, 31 is cross-coupled to the second inverter of devices 22, 32 such that a first input terminal to the first inverter is electrically coupled to a second output terminal of the second inverter, and a second input terminal of the second inverter is electrically coupled to the output terminal of first inverter. In this configuration, the cross-coupled inverters act as a memory element for storing a logic state, e.g., a logic "1" or logic "0".

As shown in FIG. 1, each memory cell $20_1, \ldots 20_{15}, 20_{16} \ldots 20_{n-1}, 20_n$ further includes: first access transistor 42 controlling electrical impedance from the first inverter NFET/PFET set of the cell, for example, to a bit line conductor 75, e.g., bitline true (BLT) conductor in which a stored data bit is written to or read from, and second access transistor 44 controlling electrical impedance from the second inverter NFET/PFET set of the cell, for example, to a bit line conductor 76 in which a stored data bit is written to or read from, e.g., a bitline complement (BLC) conductor. In one embodiment, the first and second access transistors 42 and 44 are field effect transistors (FETs). For example, the first and second access transistors 42 and 44 may be n-channel FETs or p-channel FETs. The voltage state of a memory cell may be read as voltage signals connected to respective bit line 75 (BLT) and bitline 76 (BLC).

In the embodiment depicted in FIG. 1A, the canary column 30 includes a charge pump circuit 50 for generating a Vcell voltage 55 that is applied to the common connection of each source terminal of pFETs 21, 22 of each memory cell. The charge pump circuit 50 includes an up-down control element 52 coupled with a variable voltage generator 54 that generates Vreg voltage. The Vreg voltage is input to a multiplexor device 45. A further voltage source Vcs is provided as a second input to the multiplexor device 45. Generally, the Vreg voltage is less than the Vcs voltage. In the embodiment shown, the Vreg voltage is input at a multiplexor terminal and is selected for output as the Vcell voltage responsive to a writing of a data bit value to a selected memory cell. Similarly, the Vcs voltage is input at the second multiplexor terminal and is selected for output as the Vcell voltage responsive to a reading data bit value at a selected memory cell. Thus, depending upon the write state, i.e., whether writing a zero (0) bit value to a memory cell or a one (1) bit value to the memory cell, a corresponding voltage Vreg will be applied to the cell; otherwise the Vcs power supply value will be supplied to the memory cell.

The generation of Vcell voltage 55 is controlled by multiplexor (mux) 45 that is configured to respond to a write 0 or write 1 multiplexor select voltage signal issued by the control logic 10 in which case Vreg is applied as the Vcell voltage 55. That is, a wr1∥wr0 control signal of mux 54 is either a write1 or a write0 value. Thus, Vcell is generated to replace the virtual supply voltage VDD that is typically used to bias the PFET devices 21, 22 in a selected 6T SRAM device. As further shown, the up-down controller element 52 is responsive to an up/down control signal which is a function of a read0 signal used to configure the column to read a stored data bit at a memory cell 20, and is further a function of a gblc signal obtained from the column which signal is a global output of the multiplexing of the SRAM cell outputs through an AND gate 83, in the embodiment shown in FIG. 1A. The measured delay of the gblc signal (and the signal at node0) of a write sample as compared against a calibrated value is used as the basis of adjusting the applied SRAM cell voltage.

Figure 2A:
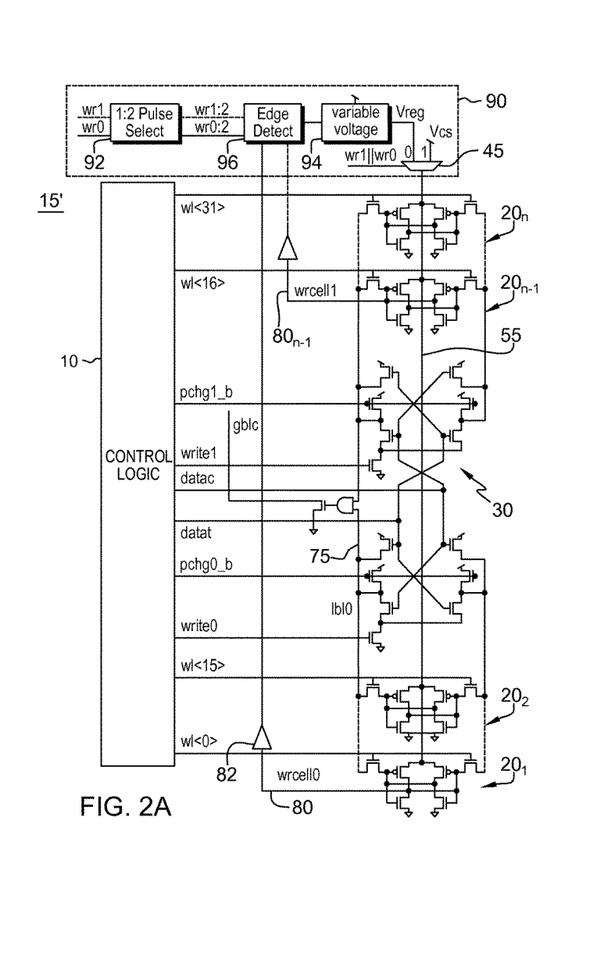
FIG. 2A is a circuit diagram for improving a memory write operations including write-through detection and control according to an embodiment of the present disclosure.
Figure 3:
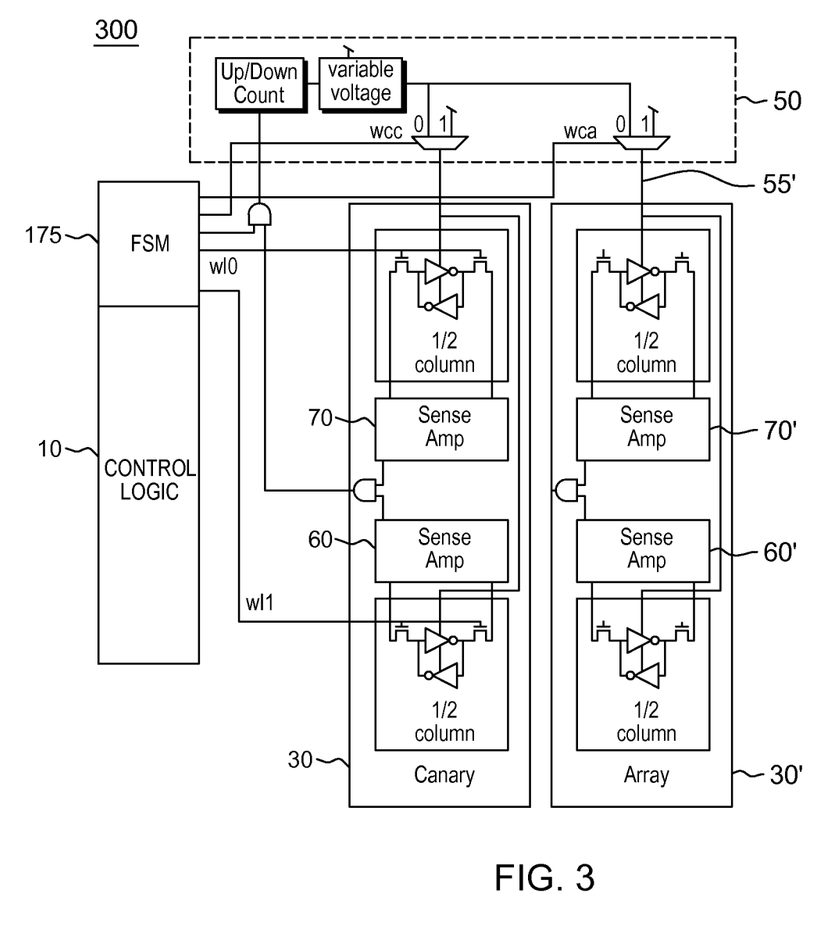
FIG. 3 shows the addition of a finite state machine (FSM) structure for sequencing writes and reads in an SRAM sensor column according to an embodiment.

In the control logic circuit 10, there is generated control signals for controlling data read and write operations including the generation of word line voltage signals 18 (WL<0> to WL<15>) that operate to select one of sixteen (16) memory cells of the array, and control the generation of word line voltage signals 19 (WL<16> to WL<31>) that operate to select a memory cell of the array. In one embodiment, the array of memory cells arranged as a canary column 30 and may be split into two column halves each having an associated pre-charge and sensing circuitry 60, 70. For example, as shown in FIGS. 1A, 2A and 3, bottom half of canary column 30 may have bit lines of memory cells, e.g., memory cells $20_1$-$20_{15}$, connected to pre-charge/sense circuitry 60, while upper half of canary column may have bit lines for memory cells, e.g., memory cells $20_{16}$-$20_n$, connecting to pre-charge/sense circuitry 70.

In the embodiment depicted, it is assumed that for a particular memory cell 20, 1:1 NFET:PFET strength makes SRAM writes difficult at low voltages. Thus, in one embodiment, the control logic 10 and associated circuitry is provided to compensate for the fact that the P-type and N-type FinFETs have equivalent drive strengths, which tends to complicate the write phase because there is no native pull direction for the write: the p-type transistor and n-type transistors pull on the cell value equally. To compensate, in one embodiment, one side of the inverter is degraded, e.g., the PFET voltage is caused to be degraded based on a sensor reading of a current operating point.

As shown in FIG. 1A, canary column 30 includes pre-charge/sense circuits 60 and 70 each capable of pre-charging bit lines 75 (e.g., BLT) and 76 (e.g., BLC), and each receiving data signals data t and data c used for writing a memory bit value into a selected cell. In the embodiment shown, the memory cells and pre-charge circuit 60 receive control signals from control logic circuit 10 for effecting reading and writing of data bits. Such signals include write0 and a pcharge0_b signals to precharge or initialize the bit line conductor 75, 76 e.g., setting or re-setting of a selected memory cell(s) to a known state, e.g., Vdd or logic "1". Likewise, in the embodiment shown, pre-charge circuit 70 receives control signal write 1 and a pcharge1_b signal from control logic circuit 10 to write to and bias (i.e., pre-charge) the bit line conductor 75, 76, e.g., setting or re-setting a selected memory cell(s) to a known state, e.g., Vdd or logic "1" Signals data t and data c correspond to respective BLT and BLC bitlines 75, 76 when performing a cell write or read operation. Each corresponding pre-charge/sense circuitry 60, 70 is coupled to both BLC and BLT conductors and activated so as to program the stored data bit value at a memory cell within the column.

To degrade one side of the inverter of a selected memory cell, e.g., a PFET voltage node, in a first approach as depicted in FIG. 1A, the system 15 utilizes control logic signals and charge pump voltage Vreg to degrade a PFET voltage at a memory cell so as to reduce its strength and thereby improve the cell's write characteristics. In this first approach of FIG. 1A, referred to as a canary approach, a single cell, column, or two columns are written to every predetermined number of cycles, e.g., 3 cycles. The canary approach operations are shown in the timing diagram 100 of FIG. 1B, in which every three (3) cycles 105 there is performed a write native operation 108, a write non-native operation 110, and a read non-native operation 112. This means, in an example embodiment, the performing of a writing of a 1 (or 0) if the natural cell write is a 1 (or 0) data bit value, then in the second cycle writing a 0 (or 1) data bit value, and then in the third cycle, a reading the 0 (or 1) data bit value. During the read, the output is either compared digitally (write succeeded or failed), or in a thermometer, an edge detector configured to determine if the write is successful.

The system 15 and control circuit 10 of FIG. 1A are configured to monitor the strength of the voltage during a memory write so as to compensate for a degraded strength of the PFET, e.g., due to operating conditions or voltage droops. This strength is measured as a degree of delay or the slope (e.g. rising edge) of the voltage at the output node when being written to or read from. For example, the monitored voltage is at one side of a PFET of a selected memory cell, such as shown as voltage indicated at the "node 0", e.g., of a selected memory cell $20_1$ as selected by control circuit's asserting a corresponding wordline WL<0>.

Figure 1B:
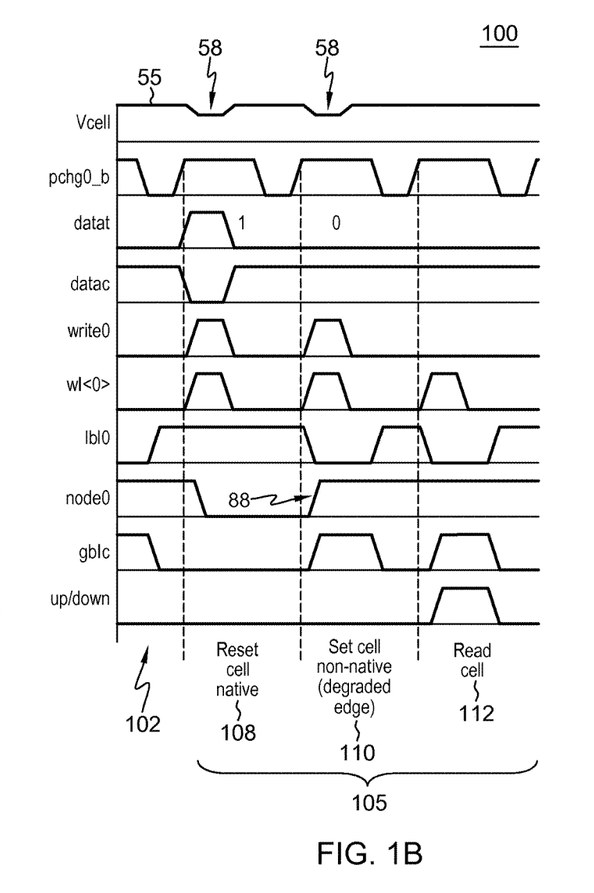
FIG. 1B is a timing diagram depicting operation of the memory write circuit of FIG. 1A according to an embodiment of the present disclosure.

In one embodiment, for the 3-cycle approach, control signals are generated in accordance with timing depicted in signal diagram 100 shown in FIG. 1B. FIG. 1B particularly depicts depicting the logic and signals used in performing the write strength sampling of a selected memory cell. Thus as shown, prior to entering the first phase, initially as shown at time 102 corresponding the cell is found in a non-native state, e.g., storing a bit 0 as node0 voltage is high. Signals write 0 and wl<0> have not been activated, data c corresponding to BLC signal line 76 is at a logic 1 level and data t corresponding to BLT signal line 75 is it a logic 0 level. Pulsed pcharg0 signal is brought down (pre-charge activated) thus voltage at lbl0 raises to a logic 1. The raising of the lbl0 voltage causes the global bitline signal gblc down during time 102.

To enter first cycle 108 of the write sampling, while pcharg0 signal is off, control circuit 10 is configured to re-set the cell by writing a native value, e.g. bit logic 1 (BLT 1 and BLC 0). It does this by activating a write 0 (e.g., a pulse) and a wordline wl<n> to select a memory cell, e.g., memory cell $20_1$ selected by wl<0>, and data corresponding to BLC signal line 76 is pulsed low at a logic 0 level and data t corresponding to BLT signal line 75 is pulsed high at a logic 1 level. The asserting of write 0 triggers the multiplexor to select the Vreg voltage that pulls Vcell signal 55 down during this cycle as shown at 58. Thus, in view of FIG. 1B, the approach provides a programmable droop voltage 58 to be applied to weaken the memory cell PFET during each write operation that is based on the cell resistance in writing the cell. In the canary approach, Vcell voltage is dropped until the value changes. The delta between Vreg and Vcell can be around 0.1-0.5V, however, may range between 0.1 V-0.3V. Responsive to the assertion of these signals to re-set the memory cell to a native value (a 1 bit value), and by the weakening of the PFET voltage at memory cell $20_1$, the node0 voltage at cell $20_1$ is pulled to zero.

In the second cycle 110 there is performed setting the activated cell to its non-native value (degraded edge). When entering second cycle 110 of the write sampling, while pcharg0 signal off, control circuit 10 is configured to set the cell by writing its non-native value, e.g., a bit logic 0 (BLT 0 and BLC 1). It does this by activating a write 0 and a wordline wl< > to select a memory cell, e.g., memory cell $20_1$ selected by asserting wl<0>, wherein data c corresponding to BLC signal line 76 is at a logic 1 level and data t corresponding to BLT signal line 75 is at a logic 0 level. The asserting of write 0 triggers the multiplexor to select the Vreg voltage that pulls Vcell voltage signal 55 down during this cycle as shown at 58 in accordance with a measured write delay, e.g., by an ABIST architecture (not shown) or by latch. Responsive to the assertion of these signals to set the memory cell to its non-native logic 0 value, and by the weakening of the PFET voltage at memory cell $20_1$ due to lowering of the PFET voltage by reducing the Vcell voltage, the node0 voltage at cell $20_1$ is pulled back up to a logic 1 value. Here, the delay in writing a bit value is exemplified by the slope 88 of pulled up (rising) edge of the voltage at node0.

During the third cycle 112, the last value written to and stored at the cell, e.g., a logic zero, is read. In FIGS. 1A and 1B, in this cycle, while pcharg0 signal is off, control circuit 10 is configured to read the stored cell value by activating a wordline wl< > to select a memory cell, e.g., memory cell $20_1$ by asserting wordline wl<0>. The values of data c and data t remain at respective voltage levels. Here, the node0 voltage remains pulled up for this read operation, however, the lbl0 voltage returns to zero and consequently gblc is pulsed until the next pre-charge cycle. The control circuit 10 further asserts the Read0 which is just a control signal that is high during a read operation. Up/Down control signal to initiate the read operation is responsive to the asserting the Read0 and gblc. It is noted that the programmable droop voltage is not permitted during a read operation, i.e., voltage droop at Vcell 55 is not allowed for a read operation during this third cycle 112.

Thus, in FIG. 1B, assuming the write native is a one (1), then, in the canary approach, there is taken a single cell, column, or 2 columns and every 3 cycles there is performed a write native, write non-native, read non-native. In another embodiment, for example, there may first be written a 0 if the natural cell write is a 0, then writing a 1, then reading a 1 in this sampling approach.

Returning to FIG. 1A, since the global bit-line is input into the circuit 10, a read timing can be performed as well. An n-bit value can be read during a read to indicate read timing margin, or a separate delay line captures during reads to generate a read code to adjust timings for the read cycle. These signals are generated in an address decode block (not shown).

Advantages of this approach include the capturing of read and write behavior with no interference with the cell itself for sensing. A single cell would take one sample/3 cycles as described herein. A column may be write tested by performing 2 samples/3 cycles. Three parallel (3) columns may be write tested by performing 1 sample/cycle.

In one embodiment, during the read operation, the output is compared digitally by determining using sensing circuit and logic whether the write operation succeeded or failed. Alternatively, the output may be used in an edge detector style thermometer, to determine if the write is successful.

That is, in an exemplary implementation, the SRAM described herein is employed in a sensor device, e.g., a thermometer, but can be implemented in any system or device.

FIG. 2A shows a version of a memory system 15' employing write-through detection and control using an edge detector. In this context, write-through means that whatever is written into the cell appears at the output of the macro or data out simultaneously. The embodiment of the system 15' of FIG. 2A, is similar to system 15 of FIG. 1A however, a charge pump circuit 90 includes a one (1) or two (2) pulse select circuit 92 operatively coupled to an edge detector circuit 96 that provides input to variable voltage generator 94 for controlling Vcell voltage 55 droop through the multiplexor 45.

In the alternative approach of FIG. 2A, the system 15' directly measures the affect being measured: write strength at the pull-up node of the PFET of a selected cell. In the embodiment shown in FIG. 2A, a conductor provides the voltage wrcell0 80 at the pull-up node of the selected memory cell $20_1$ for buffering through buffer device 82 and capture by the edge detector 96. In the system 15' of FIG. 2A, each respective memory cell is configured to provide a voltage at a respective pull-up node of the PFET for input to the edge detector 96 through a respective buffer. The edge detector 96 is running at a greater clock speed than the array clock speed. The edge capture can be a signal which can catch the leading edge of the bitline and detection is achieved through the delay chain where each stage is captured in a latch. Depending on the delay, the voltage droop for write operation can be modulated.

Figure 2B:
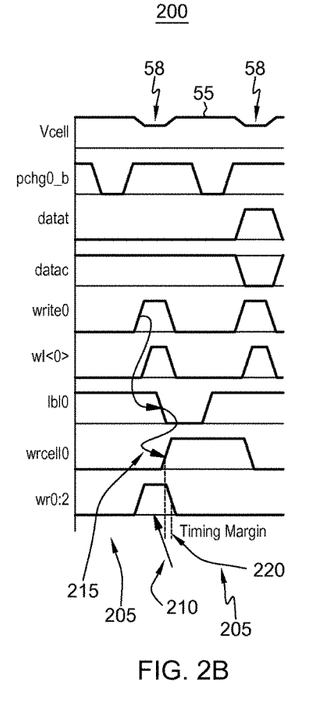
FIG. 2B is a timing diagram depicting operation of the write-through detection and control circuit of FIG. 2A according to an embodiment of the present disclosure.

The timing diagram 200 shown in FIG. 2B depicts an example of the logic and signals used in performing the write strength sampling with write-through detection according to this alternate embodiment. Here, in a first cycle 210 of the write sampling, there is written into the memory cell a known write data state (e.g., reset), and in a second cycle, the opposite data state is written (set) and read out in the same cycle as it is a write-through operation.

After writing a reset value of 1 into a selected memory cell, e.g., cell $20_1$, at a first cycle 205, it is seen that the BLC value at the PFET node is at a logic 0 and BLT is at a logic 1, thus resetting the memory cell. In the second cycle, at 210, while pcharg0 signal is off, control circuit 10 is configured to set the cell by writing its non-native value, e.g., a bit logic 0 (BLT 0 and BLC 1). It does this by activating a write 0 and a wordline wl< > to select a memory cell, e.g., memory cell $20_1$ as asserted by wl<0>, and data c corresponding to BLC signal line 76 are at a pre-charged logic 1 level and data t corresponding to BLT signal line 75 is at pre-charged logic 0 level. The asserting of write 0 triggers the multiplexor to select the Vreg voltage that pulls Vcell signal 55 down during this cycle as shown at 58 to thereby weaken the memory cell when conducting the write operation. Here, upon assertion of the write 0 pulse, the lbl0 precharge voltage level 75 is pulled down. Responsively, the node0 voltage at cell memory cell $20_1$ is pulled up to a BLC value of 1 which becomes the "wrcell0" voltage 80 input to the buffer for receipt at an edge detector input shown in FIG. 2A.

The assertion of the write 0 pulse is also received at the one or two pulse selection circuit 92 which responsively generates a wr0:2 pulse output having a falling edge delayed in time with respect to the falling edge of the lbl0 signal.

It is noted that the pulling up of the wrcell0 responsive to the bitline precharge lbl0 being pulled down (as shown in FIG. 2A, B) presents a timing margin 220 to trigger the edge detector 96 to take a reading and measure the wrcell0 voltage pull-up at the memory cell $20_1$, when the PFET is in the weakened state as a result of the applied Vcell voltage droop 58. This pull-up voltage may be measured with weak voltage as indicated at 215 in FIG. 2B. This timing margin provides a guardbanding in the edge detection circuit.

In this embodiment, there can be provided appropriate setup timing for the Vcell voltage droop before the write signal is enabled. The Vcell must be established and stable before write is enabled or the timing will be affected.

In the second cycle 110 there is performed setting the activated cell to its non-native value (degraded edge). Thus, in FIG. 2B in this second cycle 210, responsive to signals to set the memory cell to its non-native logic 0 value, and by the weakening of the PFET voltage at memory cell $20_1$ due to lowering of the PFET voltage by reducing the Vcell voltage, the wrcell0 voltage at cell $20_1$ is pulled back up to a logic 1 value which is sampled by edge detector circuit 96.

In operation, the sampling (and edge detector read) may be performed every other cycle wherein the edge detector input is reset during an off cycle such that the pull-down of the cell will not be critical. Thus during the next cycle 205 (an off-cycle), the opposite bit state, e.g., a logic 1 data value, is again written into the memory cell $20_1$.

Thus, advantageously in this second approach, the read operation is decoupled, and secondary effects of VCS voltage is removed. Thus, this write sampling scheme may be used to obtain 1 sample every two (2) cycles.

In the system 15' of FIG. 2A, some measure of the delay margin is determined from automatic built in self-test (ABIST) failure rate results. During operation, the offset of the current reading from a prior conducted calibrated reading determines the write strength. The control logic circuit 10 sets the conditions for the writes and reads responsive to this determination. An ABIST system that may be employed in determining the delay margin may be found in United States Patent Application 20060174175, incorporated by reference herein.

In the embodiment of FIG. 2A, the function of edge detector 96 is to detect transitions between two states in the input sequence, e.g., a "0" data bit and "1" bit. It does this by outputting a data 0 as long as the most recent input state is the same as the previous one. However, when the most recent one differs from the previous one, it outputs a "1" bit. By convention, the edge detector can output a "0" bit after reading the very first state. Edge detection based on the delay is critical and is performed through the latches. Thus in one aspect, the embodiments of FIGS. 1A and 2A act like a Finite state machine, i.e., depending on the finite input states, it calculates the corresponding states of the output. A finite state machine is one that has a limited or finite number of possible states. Only a single state can be active at the same time, so the machine must transition from one state to another in order to perform different actions.

Thus, in an example implementation of a system 300 shown in FIG. 3, a finite state machine (FSM) 175 may be implemented to control the sequencing of read/write operations to the redundant canary column 30 for regular sampling, and like manner, based on the canary column results, control the write operations at the regular memory array 30'. It may use unique signals as described herein with respect to FIGS. 1A, 2A, and/or add additional control to existing read/write signals. In the system of FIG. 3, further columns 30' of an actual array of memory cells is provided as column halves in parallel to the corresponding column halves of the canary column 30 of dummy cells and having pre-charge/sense amplifiers 60' and 70' corresponding to the pre-charge/sense amplifiers 60, 70 in the canary column 30 for respective lower and upper column array halves. The charge pump circuit 50 such as shown in FIG. 1A or pump circuit 90 such as shown in FIG. 2A may be extended for use in controlling the SRAM memory cell PFET transistor strength at a memory cell by modifying Vcell voltage 55 at the canary column 30 and at the regular array column 30' of memory cells, and controlling the SRAM memory cell PFET transistor strength at a memory cell by modifying a Vcell voltage 55' at the selected memory cell of a column array 30' of memory cells. If sampling is only intended in array 30' without a canary column, the FSM 175 may be replaced by logic to determine a transitioning edge (e.g., a default value won't trigger timing event).

Herein, an edge detector may be set and reset by control logic to match array read or 3-cycle continuous sampling. The canary column 30 can be one of the redundant columns. In particular, the FSM 175 is provided due to the continuous nature of the sampler. The regular array control structure may not have the logic to keep the canary active, so the FSM 175 is needed to sequence the writes and reads in that sensor column.

Figure 4:
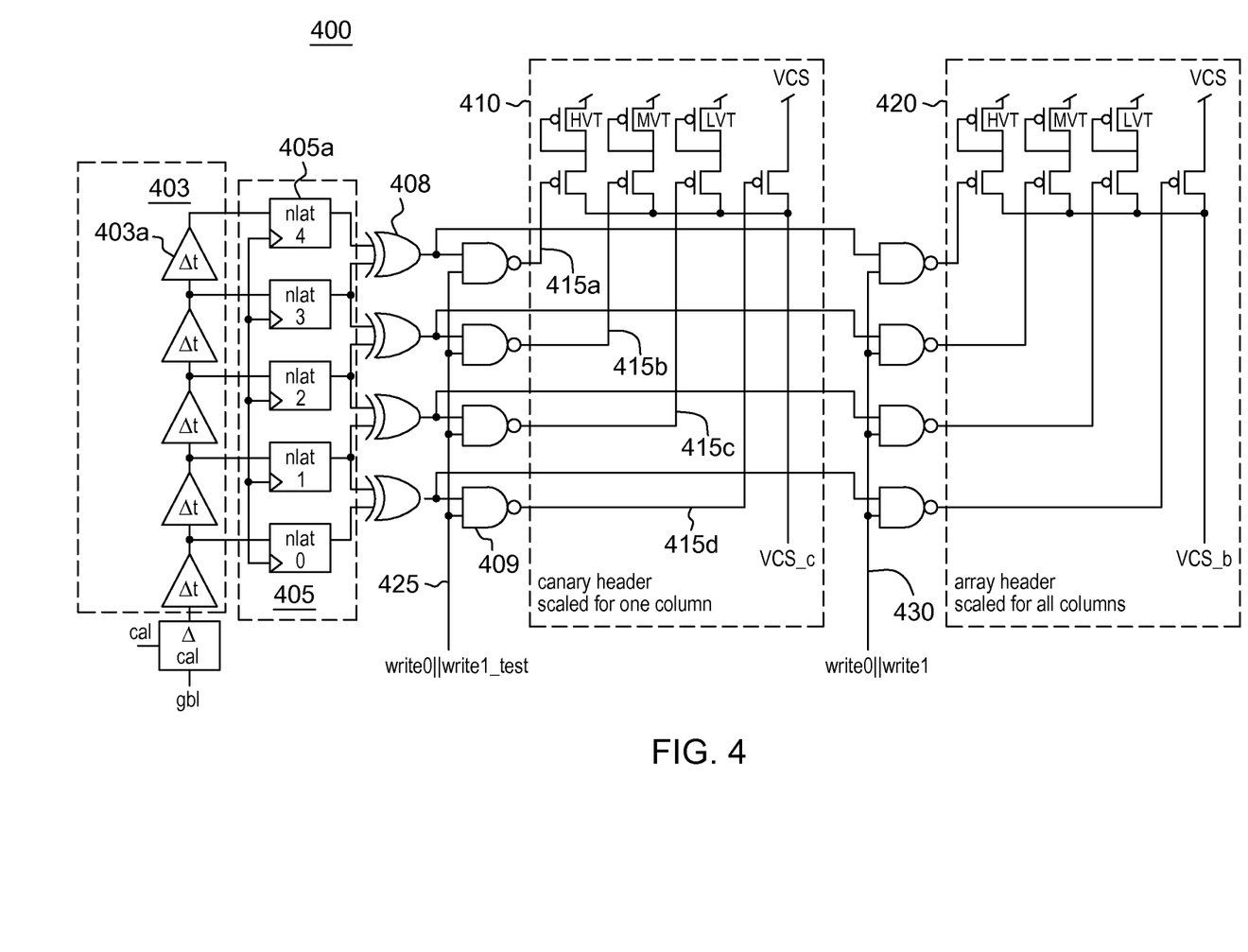
FIG. 4 shows the use of a Critical Path Monitor (CPM) configuration and supply voltage switch logic circuit additions according to an embodiment.

Further to the embodiments described herein, FIG. 4 shows an approach to edge detection and operation of write sampling using latches to capture the delay of a cell node at the edge detector. In FIG. 4, edge detection circuit 400 includes a series of delay buffers 403 (a delay chain) which receive an input signal from one of two sources: a calibration signal "cal" of a measured delay as obtained from a source such as an ABIST circuit, or a pull-up node voltage "gbl" of a selected memory cell obtained in real-time. Each delay buffer 403a includes a predetermined delay Δt, and an output of each delay buffer is input to a respective latch 405a of cooperatively connected series of latches 405 used to measure a delay of the input signal. Here, the series of latches are calibrated to trigger according to a threshold delay representative of a write failure as previously obtained from calibration signal. That is, in one embodiment, calibration is achieved through use of ABIST (Array Built in Self Test) which generates write signals and tries to write into the cell by lowering the supply voltage of the cell. For each voltage it will measure the delay and assign a voltage droop value to it, and thus calibration is achieved.

That is, initially, using the set of latches 405, the impact of delay in writing the memory cell is evaluated. i.e., the minimum delay required to write the cell is calculated. In edge detection system 400, the latch's 405 output voltage signals are fed to parallel connected XOR gates 408 whose outputs are fed into respective connected AND gates 409 which gate selection of a particular drooped Vcell value (Vreg) using output signals 415a, 415b, 415c and 415d. These signals are used to generate a particular drooped Vcell value at either or both a variable voltage circuit (header) 410 (sourcing Vcell voltage to the cells of the canary column 30) and the variable voltage circuit (header) 420 (sourcing Vcell voltage to the actual memory cells for all columns of the storage array). The selection of whether the Vcell signals are applied to the canary column is determined by the input write0 or write1_test signals 425 received at each AND gate at canary header 410. Likewise, selection of whether the Vcell signals are applied to a storage array column is determined by the input write0 or write1 signals 430 received at each AND gate at array header 420.

Thus, as shown in the edge detector circuit 400 and variable voltage sources 410, 420 of FIG. 4, the output of the latches 405 are XORed with other signals and are fed into each the respective header devices 410, 420 each with multiple Vt (voltage threshold) settings. Depending on the detected delay (e.g., small or large) the Vreg supply voltage to the selected cell(s) will correspondingly droop smaller or larger to facilitate writing into the cell(s). Essentially the Vcell voltage is collapsed depending on the write delay. A larger delay will cause more voltage droop at the Vcell input.

In a non-limiting embodiment, there are three different voltage droop amounts HVT, MVT and LVT that can be selected for use in weakening a cell during a write operation. As shown in the embodiment of FIG. 4, a header 410, 420 will supply a voltage droop labeled HVT (high threshold voltage), e.g., when a large signal delay is detected, MVT (medium threshold voltage), e.g., when a medium signal delay is detected, and LVT (low threshold voltage), e.g., when a smaller signal delay is detected.

It is understood that FIG. 4 can also be designed with unified control: one block of headers for all the logic.

Figure 5:
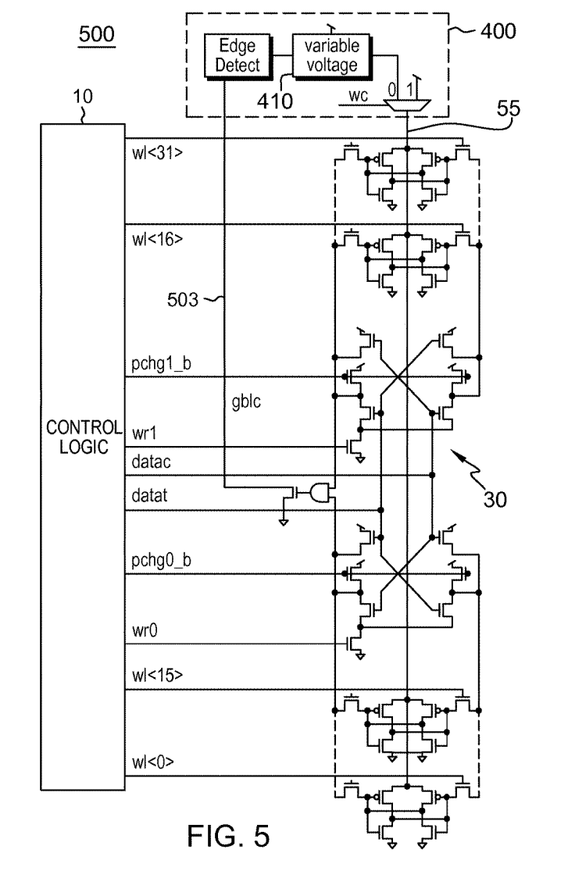
FIG. 5 is a circuit diagram for improving a memory write operation including implementation of an edge detection circuit/logic employing the CPM circuit embodiment of FIG. 4.

FIG. 5 is a circuit diagram for improving a memory write operation of a canary memory column through which the edge is detected by edge detector circuit 400 of FIG. 4. That is, FIG. 5 includes canary column elements such as shown in and described with respect to FIG. 1A, and functions similarly to adapt the applied memory cell voltage, however, by implementing the edge detector circuit 400 and variable voltage source 410 of FIG. 4 to modify the Vcell voltage droop according to the detected strength of a memory cell. Here, a selected memory cell output signal is embodied as a multiplexed output signal "gblc" 503, and is received at the edge detector monitored by CPM control circuit for determining memory cell write strength as described herein with respect to FIG. 4. Any determined voltage "droop" value may be used to control the memory cells of an active memory array column.

Figure 6:
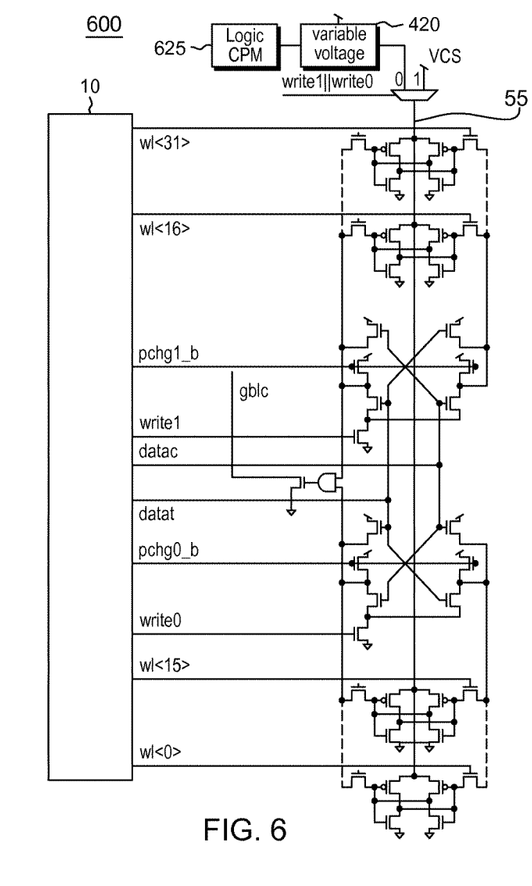
FIG. 6 is a circuit diagram for improving a memory write operation including implementation of CPM and voltage switch logic CPM.

In an alternate embodiment, FIG. 6 does not require the canary column as the CPM logic does the job of detecting delays of the memory cell. Here, the array column circuit 600 depicted in FIG. 6 is a similar version showing a logic CPM (critical path monitor) element 625 coupled to the variable voltage source 420 such as shown in FIG. 4. In the embodiment of the memory column circuit 600 of FIG. 6, there is no need to read the data from the cell. The CPM (from Logic side) delay output modulates with respect to temperature and voltages. This is fed into header block gated by write signal. When a write operation (signal) is asserted "on", then the supply voltages are lowered.

During operation, the voltage and temperature changes will reflect offsets in the CPM which will offset the cell voltage correspondingly. Here, there is written voltage shifts as an operating voltage and/or temperature drift. In this embodiment, there is no requirement or use of a canary cell. Thus, in embodiments employing CPM logic, the control can be located away from the memory cell array to simplify implementation and reduce the array area.

Thus, the approach to write sampling as depicted in the circuit 600 of FIG. 6, shows an open loop option, whereby the cells are undisturbed except for the cell write voltage 55. The logic CPM 625 is calibrated with a delay based on the detected ABIST failure rates (and some built-in margin). For example, the CPM is calibrated to some margin on write voltage by adjusting voltage until no failures occur in ABIST testing.

Figure 7:
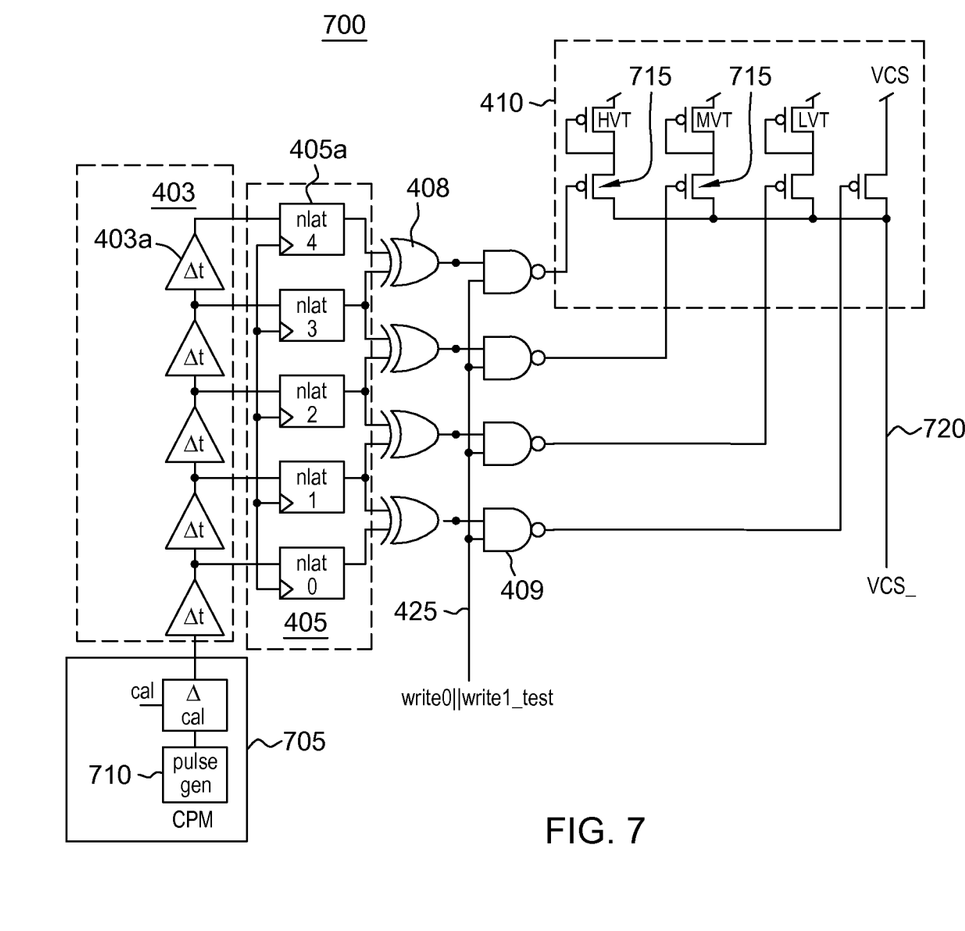
FIG. 7 is a circuit diagram for improving a memory write operation by employing CPM and Voltage Switch Logic CPM according to a further embodiment.

FIG. 7 depicts a further embodiment of an edge detection circuit 700 similar in operation to the CPM edge detection circuit 400 of FIG. 4. Herein, a CPM element 705 including delay chain 403 and pulse generator elements 710 is used to calibrate the delay chain 403 and operatively connected latches 405 used in edge detection. In one embodiment, the CPM element 705 performs n-cycle sampling so that the current memory cell strength is always updated to instant local noise. That is, the pulse generator element 710 initiates a sampling operation periodically, wherein a calibration signal is used to calibrate the edge detector, so that the supply voltage applied to the memory cells during a memory write operation may be continuously monitored/adjusted as described herein with respect to the edge detection circuit 400 of FIG. 4.

In the approach using the CPM and voltage switch logic, it is assumed that when not writing to a memory cell, each of the PFET devices 715 are on, placing the VCS voltage 720 on the column power. As described herein with respect to FIG. 4, when a large signal delay margin is detected by a latch, e.g., nlat 3 or nlat 4, then the voltage supply to the cell column is reduced more, i.e., the VCS voltage 720 on the column power becomes the larger decreased HVT (high threshold voltage). Similarly, when a reduced signal delay margin is detected by a latch, e.g., nlat 0 or nlat 1, then the voltage supply to the cell column is reduced less, i.e., the VCS voltage 720 on the column power becomes the smaller decreased LVT (Low threshold voltage).

Thus, the approaches of the present disclosure employ two aspects: 1) detection of the SRAM write failures and corrective action, such as detection of write operation failures in SRAMs caused by voltage droops, temperature rise, and other conditions; and 2) a correction mechanism. Voltage adjustment are made to weaken cell during write and to strengthen cell during read. Embodiments such as shown in FIGS. 6 and 7 provide for the continuous sampling of array write and read to adjust voltage magnitude dynamically for most efficient operating point. The triggering of reading and sensing operations in an array are based on normal reads and writes that use no canary cells. Further, the embodiments described herein are scalable from single sub-array to full array coverage.

Advantageously, the embodiment described herein compensate for cross-chip variation in arrays by adapting local voltage in each sub-array. A means for dynamic voltage control of arrays is provided with sensing and actuation mechanism. Thus, the overhead of sensing and control is reduced. Moreover, the embodiments present a scalable solution that can be fine-grained at the smallest sub-cell or implemented at one per array without design changes. The effect is that there is a reduced dependence on strong-cell/ weak-cell in write stage to improve read and retention stability.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A memory system comprising:
an array of memory cells, each memory cell comprising a programmable memory cell providing first true bit signal and complement bit signal outputs representing a stored bit value;
a control circuit applying control signals for selecting a memory cell and controlling bit value write or read operations performed on the selected memory cell, said memory cell having an internal node providing one of the bit signal outputs;
an edge detector circuit for detecting a strength of a signal transitioning in to or out from the selected memory cell by measuring a delay in a voltage signal transition at the internal node of the selected cell when writing a bit value signal to the selected memory cell, said edge detector circuit receiving said signal from the selected memory during said write operation, said edge detector circuit comprising a series of delay buffers and operatively connected latches, each latch for capturing an output of a delay buffer stage and configured to trigger upon detecting an associated delay of the voltage signal transition of said received signal;
a variable voltage source for applying a supply voltage to said selected memory cell when performing a write or read operation, said supply voltage applied modifying the strength of said selected memory cell in accordance with said detected signal strength.

2. The memory system of claim 1, wherein said array is organized as a plurality of columns, at least one column including a plurality of redundant column of dummy cells, said selected memory cell being a dummy cell of said redundant column.

3. The memory system of claim 1, wherein said series of delay buffers and operatively connected latches of said edge detector circuit are calibrated according to a received calibration signal representing a correctly operating transistor device delay voltage measurement.

4. The memory system of claim 3, wherein said correctly operating transistor device delay voltage measurement is obtained from an automatic built-in self test system in communication with said memory system.

5. The memory system of claim 1, wherein said variable voltage source includes a charge pump, a triggered latch device generating for receipt at said charge pump, a signal associated with detecting an associated delay of said received voltage signal, and said charge pump sourcing a different supply voltage to said memory cell responsive to said generated signal.

6. A method of operating a memory system having an array of memory cells, each memory cell comprising a programmable memory cell providing first true bit signal and complement bit signal outputs representing a stored bit value, the method comprising:

applying control signals for selecting a memory cell and controlling a bit value write or read operation performed at the selected memory cell, said memory cell having an internal node providing one of the bit signal outputs;

detecting a strength of a signal transitioning in to or out from the selected memory cell by measuring a delay in a voltage signal transition at the internal node of the selected cell when writing a bit value signal to the selected cell, wherein said measuring a delay in writing a bit value to the selected cell comprises:

receiving, at an edge detector circuit, said signal from the selected memory during said write operation, said edge detector circuit comprising a series of delay buffers and operatively connected latches, each latch for capturing an output of a delay buffer stage; and triggering one of said latches upon detecting an associated delay of said voltage signal transition of said received signal; and applying, responsive to said detected strength, a supply voltage to said selected memory cell when performing a write or read operation, said supply voltage applied modifying the strength of said selected memory in accordance with said detected signal strength.

7. The method of claim 6, further comprising:

receiving, at said edge detector circuit, a calibration signal representing a correctly operating transistor device delay voltage measurement; and calibrating said series of delay buffers and operatively connected latches of edge detector circuit according to the calibration signal.

8. The method of claim 6, wherein said method further comprising: using a triggered latch output signal to select a charge pump supply voltage applied to a memory cell of a second column.

9. A method of operating a memory cell device of a memory system having an array of memory cells, each memory cell comprising a programmable memory cell providing first true bit signal and complement bit signal outputs representing a stored bit value, the method comprising:

applying control signals to a memory cell of a first column for performing a write operation;

applying control signals to the memory cell of said first column for reading said stored bit value;

determining from said read value, a voltage delay associated with reading said bit value, wherein said determining from said read value a voltage delay associated with reading said bit value comprises:

receiving, at an edge detector circuit, said signal from the selected memory cell during said read operation, said edge detector circuit comprising a series of delay buffers and operatively connected latches, each latch for capturing an output of a delay buffer stage, said method further comprising:

triggering one of said latches upon detecting an associated delay of a voltage signal transition of said received signal; and using a triggered latch output signal to adjust a supply voltage applied to a memory cell, said triggered latch output signal selecting a supply voltage applied to a memory cell of a second column based on said voltage delay, said adjusted supply voltage at said applied memory cell improving a data write operation characteristic at the memory cell of the second column.

10. The method of claim 9, wherein said applying control signals for performing a write operation to a memory cell of a first column comprises:

applying first control signals in a first time interval to re-set a memory cell to store a first bit value state;

applying second control signals in a second time interval to set a memory cell to store a second opposite bit value state; and said reading of said stored data bit value occurring in a third time interval.

11. The method of claim 9, further comprising: applying control signals for performing a write-through operation at a memory cell of a first column, said control signals comprising:

first control signals to re-set a memory cell to store a first bit value state in a first time interval;

second control signals to set a memory cell to store a second opposite bit value state in a second time interval;

said reading of said stored data bit value occurring in said second time interval.

12. The method of claim 9, wherein said first column is a redundant column having an array of dummy cells, and said second column include memory cells of a memory storage array.

13. The method of claim 9, further comprising:

using a finite state machine to apply control signals for sequencing read and write operations of a selected memory cell and modifying said supply voltage according to a detected signal strength.

14. A memory system comprising:

an array of memory cells, each memory cell comprising a programmable memory cell providing first true bit signal and complement bit signal outputs representing a stored bit value;

a critical path monitor (CPM) element detecting one or more: temperature shifts and voltage changes in said memory cells array, said detected temperature shifts and voltage changes causing an associated output voltage timing delay;

an edge detector circuit for receiving a calibration signal based on a delay margin determined from an automatic built in self-test (ABIST) failure rate, said edge detector circuit comprising a series of delay buffers and operatively connected latches, each latch for capturing an output of a delay buffer stage and configured to trigger upon detecting an associated delay of a voltage signal transition of said received calibration signal; and a variable voltage source coupled to said CPM element for applying a supply voltage to said selected memory cell when performing a write or read operation, wherein a strength of the supply voltage applied to a selected memory cell is decreased in accordance with said associated voltage timing delay for a cell write operation.

15. The memory system of claim 14, further comprising:
a pulse generator for initiating periodic sampling operations such that a current memory cell strength is continuously adjusted.

16. The memory system of claim 14, wherein said CPM element performs n-cycle sampling so that the current memory cell strength is always updated to an instant local noise.

* * * * *